United States Patent
Zhang et al.

(10) Patent No.: US 9,729,276 B2
(45) Date of Patent: Aug. 8, 2017

(54) DECODING METHOD AND DECODER

(71) Applicant: Huawei Technologies Co., Ltd., Shenzhen, Guangdong (CN)

(72) Inventors: Lijia Zhang, Beijing (CN); Yuanda Huang, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 65 days.

(21) Appl. No.: 14/954,248

(22) Filed: Nov. 30, 2015

(65) Prior Publication Data
US 2016/0080112 A1    Mar. 17, 2016

Related U.S. Application Data

(63) Continuation of application No. PCT/CN2013/076549, filed on May 31, 2013.

(51) Int. Cl.
*H04L 1/00*        (2006.01)
*H03M 13/25*    (2006.01)

(52) U.S. Cl.
CPC ........ *H04L 1/0054* (2013.01); *H03M 13/256* (2013.01); *H04L 1/006* (2013.01); *H04L 1/0052* (2013.01)

(58) Field of Classification Search
CPC ....... H04L 1/00; H04L 1/0054; H04L 1/0052; H04L 1/006; H04M 13/256
See application file for complete search history.

(56) References Cited

U.S. PATENT DOCUMENTS

| | | | |
|---|---|---|---|
| 5,604,772 A | 2/1997 | Botto et al. | |
| 6,256,352 B1 | 7/2001 | Chang | |
| 6,370,201 B1* | 4/2002 | Abbaszadeh | ..... H04L 25/03197 375/262 |
| 6,424,685 B1 | 7/2002 | Hessel et al. | |
| 2001/0010710 A1 | 8/2001 | Kim | |
| 2002/0031190 A1* | 3/2002 | Ophir | .................... H04L 1/0042 375/265 |

(Continued)

FOREIGN PATENT DOCUMENTS

| | | | |
|---|---|---|---|
| CN | 1306367 A | 8/2001 | |
| CN | 1614897 A | 5/2005 | |

(Continued)

*Primary Examiner* — Jaison Joseph

(57) ABSTRACT

Embodiments of the present invention relate to the field of communications, and provide a decoding method and a decoder, which are used to reduce decoding complexity. The method includes: receiving a to-be-decoded signal; performing region decision on the to-be-decoded signal according to a region decision rule formed by S region decision formulas, to acquire a region decision result; acquiring N constellation points according to the decision result, where the N constellation points are separately constellation points that are in the N subsets and that are closest to the to-be-decoded signal; acquiring N non-encoded bits corresponding to the N constellation points, and branch metrics between the to-be-decoded signal and the N constellation points; and performing Viterbi decoding based on the branch metrics and the N non-encoded bits, and outputting a decoding result corresponding to the to-be-decoded signal. The present invention is applicable to a signal decoding scenario.

12 Claims, 5 Drawing Sheets

(56) References Cited

U.S. PATENT DOCUMENTS

| | | | |
|---|---|---|---|
| 2005/0010855 A1* | 1/2005 | Lusky | H03M 13/253 |
| | | | 714/796 |
| 2005/0097430 A1 | 5/2005 | Park | |
| 2008/0056412 A1 | 3/2008 | Bock et al. | |
| 2009/0161957 A1 | 6/2009 | Chan et al. | |
| 2009/0285278 A1 | 11/2009 | Mamaril et al. | |

FOREIGN PATENT DOCUMENTS

| | | |
|---|---|---|
| CN | 101123439 A | 2/2008 |
| CN | 101465934 A | 6/2009 |
| CN | 101710829 A | 5/2010 |
| CN | 102611457 A | 7/2012 |
| CN | 102664862 A | 9/2012 |
| WO | 98/20617 A1 | 5/1998 |

\* cited by examiner

DECODING METHOD AND DECODER

CROSS-REFERENCE TO RELATED APPLICATIONS

This application is a continuation of International Application No. PCT/CN2013/076549, filed May 31, 2013, which is hereby incorporated by reference in its entirety.

TECHNICAL FIELD

The present invention relates to the field of communications, and in particular, to a decoding method and a decoder.

BACKGROUND

As services, such as voice, image, and video, impose an ever-increasing requirement on a capacity of an optical transport network, higher order QAM (Quadrature Amplitude Modulation, quadrature amplitude modulation) with high spectral efficiency draws much attention. However, as a modulation order increases, a system transmission distance is becoming shorter due to a limitation of the OSNR (Optical Signal To Noise Ratio, optical signal-to-noise ratio). A TCM (Trellis Coded Modulation, trellis coded modulation) technology is a coding and modulation technology that combines coding and modulation to achieve optimal spectral efficiency and optimal power utilization as a whole, and the TCM technology still retains relatively good OSNR performance under a high spectral efficiency condition.

In the prior art, a structure of a TCM encoder, as shown in FIG. 1, includes a convolutional encoder and a mapper. A TCM encoding process is: if a total of N bits of input information are received by the TCM encoder, input K bits of input information in the N bits of input information into the convolutional encoder for convolutional encoding processing to produce one bit of redundancy and output K+1 bits; and input the K+1 bits obtained through convolutional encoding processing, along with N-K bits that do not undergo convolutional encoding processing, into the mapper to produce an I baseband signal and a Q baseband signal that are used for M-QAM modulation, where M represents the number of constellation points in a constellation diagram during QAM modulation; M constellation points are divided into P subsets before mapping is performed in the mapper, and each subset includes M/P constellation points. K+1 bits of signals output by the foregoing convolutional encoder are used for selecting a subset from the P subsets, and the non-encoded N-K bits are used for selecting one constellation point from the M/P constellation points in the selected subset.

After a signal obtained by TCM encoding reaches a signal receiver through transmission, a TCM decoder performs TCM decoding on the received signal. In the prior art, a TCM decoding process is: calculate Euclidean distances between a signal and all the M constellation points in the constellation diagram, and perform comparison and selection to determine a constellation point closest to a received signal in each subset, so as to acquire branch metrics and pre-output non-encoded bit values; and then, perform Viterbi decoding based on the branch metrics and the pre-output non-encoded bit values to output final decoded information.

In the existing TCM decoding process, Euclidean distances between a received signal and all constellation points in a constellation diagram need to be calculated, and therefore a large number of multipliers and adders are required. As a QAM modulation order increases, complexity of a decoder increases proportionally.

SUMMARY

Embodiments of the present invention provide a decoding method and a decoder, which are used to reduce decoding complexity.

To achieve the foregoing objective, the embodiments of the present invention use the following technical solutions:

According to a first aspect, an embodiment of the present invention provides a decoding method, including: receiving a to-be-decoded signal; performing region decision on the to-be-decoded signal according to a region decision rule formed by S region decision formulas, to acquire a region decision result, where S is a positive integer and is less than the total number of constellation points included in N subsets that are used as a basis for generating the decoded signal at an encoding end, N is a positive integer greater than 1, every two constellation points in each subset are separately located in two different regions that are divided by using at least one decision formula in the S region decision formulas, and constellation points in the constellation diagram are divided into N subsets; acquiring N constellation points according to the decision result, where the N constellation points are separately constellation points that are in the N subsets and that are closest to the to-be-decoded signal; acquiring N non-encoded bits corresponding to the N constellation points, and branch metrics between the to-be-decoded signal and the N constellation points; and performing Viterbi decoding based on the branch metrics and the N non-encoded bits, and outputting a decoding result corresponding to the to-be-decoded signal.

According to a first possible implementation manner of the first aspect, the performing region decision on the to-be-decoded signal according to a region decision rule formed by S region decision formulas, to acquire a region decision result includes: performing calculation by separately substituting the to-be-decoded signal into the S region decision formulas, determining whether a calculation result is greater than 0, and acquiring S region decision results according to a determining result.

With reference to the first aspect, in a second possible implementation manner of the first aspect, the performing region decision on the to-be-decoded signal according to a region decision rule formed by S region decision formulas, to acquire a region decision result includes: performing translation and rotation processing on the to-be-decoded signal according to the S region decision formulas, determining whether an imaginary part of the to-be-decoded signal is greater than 0, and acquiring S region decision results according to a determining result.

With reference to the first aspect or the first or the second possible implementation manner of the first aspect, in a third possible implementation manner of the first aspect, at least one region decision formula in the S region decision formulas includes: a perpendicular bisector between any two constellation points in at least one subset of the N subsets.

With reference to the first aspect or any one of the first to the third possible implementation manners of the first aspect, in a fourth possible implementation manner of the first aspect, the acquiring N constellation points according to the decision result includes: acquiring the N constellation points according to the decision result and a first mapping table, where the first mapping table is a table of correspondences between decision results and constellation points; and each decision result in the first mapping table is corresponding to one group of constellation points, and the group of constellation points are formed by the N constellation points that are from the N subsets separately.

With reference to the first aspect or any one of the first to the fourth possible implementation manners of the first aspect, in a fifth possible implementation manner of the first aspect, the acquiring N non-encoded bits corresponding to the N constellation points, and branch metrics between the to-be-decoded signal and the N constellation points includes: searching a second mapping table according to the N constellation points to acquire non-encoded bits corresponding to the N constellation points, and the branch metrics between the to-be-decoded signal and the N constellation points, where the second mapping table is a table of correspondences between constellation points, non-encoded, and branch metrics.

According to a second aspect, an embodiment of the present invention provides a decoder, including: a receiving unit, configured to receive a to-be-decoded signal; an acquiring unit, configured to perform, according to a region decision rule formed by S region decision formulas, region decision on the to-be-decoded signal that is received by the receiving unit, to acquire a region decision result, where S is a positive integer and is less than the total number of constellation points included in N subsets that are used as a basis for generating the decoded signal at an encoding end, N is a positive integer greater than 1, every two constellation points in each subset are separately located in two different regions that are divided by using at least one decision formula in the S region decision formulas, constellation points in the constellation diagram are divided into N subsets, the acquiring unit is further configured to acquire N constellation points according to the decision result, the N constellation points are separately constellation points that are in the N subsets and that are closest to the to-be-decoded signal, and the acquiring unit is further configured to acquire N non-encoded bits corresponding to the N constellation points, and branch metrics between the to-be-decoded signal and the N constellation points; and a decoding unit, configured to perform Viterbi decoding based on the branch metrics and the N non-encoded bits that are acquired by the acquiring unit, and output a decoding result corresponding to the to-be-decoded signal.

In a first possible implementation manner of the second aspect, the acquiring unit is specifically configured to perform calculation by separately substituting the to-be-decoded signal into the S region decision formulas, determine whether a calculation result is greater than 0, and acquire S region decision results according to a determining result.

With reference to the second aspect, in a second possible implementation manner of the second aspect, the acquiring unit is specifically configured to perform translation and rotation processing on the to-be-decoded signal according to the S region decision formulas, determine whether an imaginary part of the to-be-decoded signal is greater than 0, and acquire S region decision results according to a determining result.

With reference to the second aspect, or the first or the second possible implementation manner of the second aspect, in a third possible implementation manner of the second aspect, at least one region decision formula in the S region decision formulas includes: a perpendicular bisector between any two adjacent constellation points in at least one subset of the N subsets.

With reference to the second aspect or any one of the first to the third possible implementation manners of the second aspect, in a fourth possible implementation manner of the second aspect, the acquiring unit is specifically configured to acquire the N constellation points according to the decision result and a first mapping table, where the first mapping table is a table of correspondences between decision results and constellation points; and each decision result in the first mapping table is corresponding to one group of constellation points, and the group of constellation points are formed by the N constellation points that are from the N subsets separately.

With reference to the second aspect or any one of the first to the fourth possible implementation manners of the second aspects, in a fifth possible implementation manner of the second aspect, the acquiring unit is specifically configured to search a second mapping table according to the N constellation points to acquire non-encoded bits corresponding to the N constellation points, and the branch metrics between the to-be-decoded signal and the N constellation points, where the second mapping table is a table of correspondences between constellation points, non-encoded, and branch metrics.

The embodiments of the present invention provide a decoding method and a decoder. After a to-be-decoded signal is received, region decision is performed on the to-be-decoded signal according to a region decision rule formed by S region decision formulas, to acquire a region decision result; N constellation points are acquired according to the region decision result; N non-encoded bits corresponding to the N constellation points, and branch metrics between the to-be-decoded signal and the N constellation points are acquired; and Viterbi decoding is performed on the N non-encoded bits and the branch metrics to acquire a decoding result. In this way, when decoding is performed, the N constellation points and the branch metrics may be acquired for Viterbi decoding to acquire the decoding result, with no need to calculate Euclidean distances between the to-be-decoded signal and all constellation points in a constellation diagram, thereby reducing decoding complexity. Further, after the decision result is acquired, the N constellation points may be acquired by using a first mapping table, and a second mapping table is searched according to the N constellation points to acquire the branch metrics and the N non-encoded bits, thereby reducing decoding time. In addition, the branch metrics may be obtained, with no need to perform a large amount of calculation, thereby further improving the system efficiency and reducing the decoding complexity.

BRIEF DESCRIPTION OF THE DRAWINGS

To describe the technical solutions in the embodiments of the present invention or in the prior art more clearly, the following briefly introduces the accompanying drawings required for describing the embodiments or the prior art. Apparently, the accompanying drawings in the following description show merely some embodiments of the present invention, and a person of ordinary skill in the art may still derive other drawings from these accompanying drawings without creative efforts.

DETAILED DESCRIPTION

The following clearly describes the technical solutions in the embodiments of the present invention with reference to the accompanying drawings in the embodiments of the present invention. Apparently, the described embodiments are merely some but not all of the embodiments of the present invention. All other embodiments obtained by a person of ordinary skill in the art based on the embodiments of the present invention without creative efforts shall fall within the protection scope of the present invention.

Figure 1:
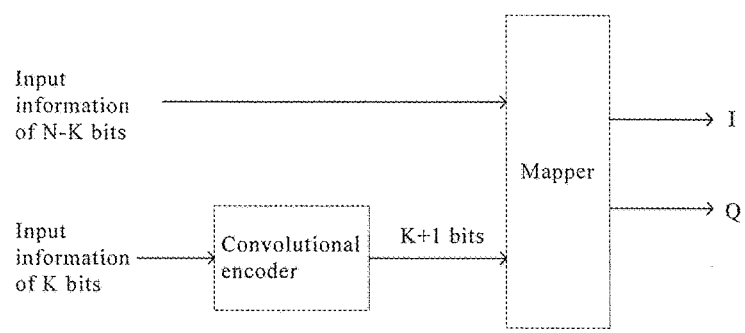
FIG. 1 is a schematic structural diagram of an encoder in the prior art.
Figure 2:
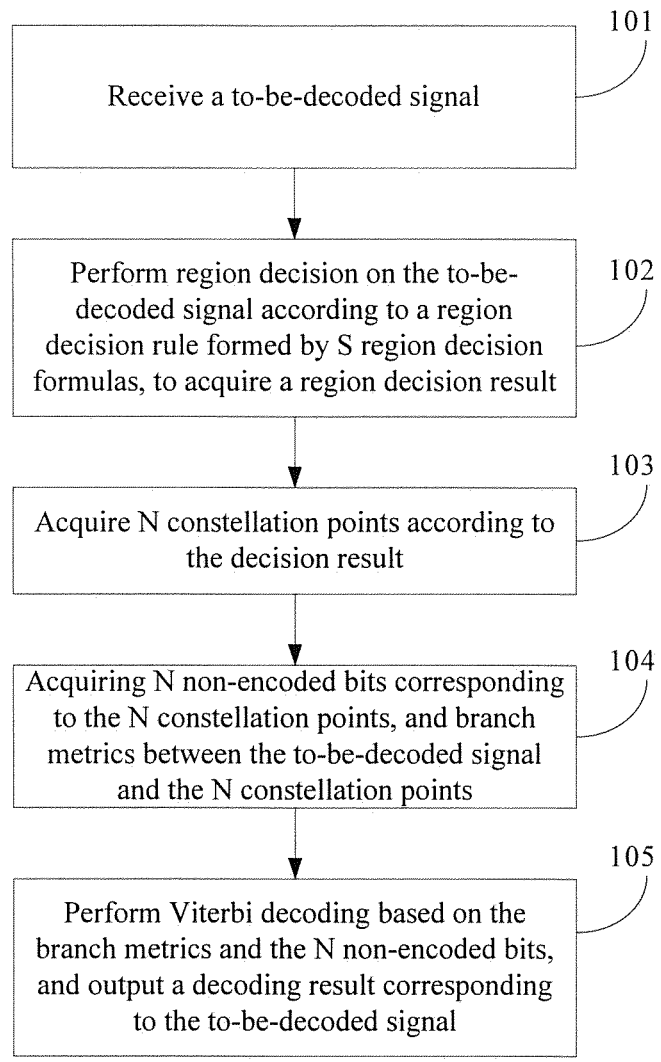
FIG. 2 is a schematic diagram of a decoding method according to an embodiment of the present invention.

An embodiment of the present invention provides a decoding method, and as shown in FIG. 2, the method includes:

101: Receive a to-be-decoded signal.

102: Perform region decision on the to-be-decoded signal according to a region decision rule formed by S region decision formulas, to acquire a region decision result.

S is a positive integer and is less than the total number of constellation points included in N subsets that are used as a basis for generating the decoded signal at an encoding end, and N is a positive integer greater than 1. Every two constellation points in each subset are separately located in two different regions that are divided by using at least one decision formula in the S region decision formulas, and constellation points in the constellation diagram are divided into N subsets.

Specifically, the region decision rule formed by the S region decision formulas may be substituting the to-be-decoded signal into the S region decision formulas to perform calculation, and performing decision according to a calculation result. The region decision rule may also be performing corresponding translation and rotation processing on the to-be-decoded signal according to the S region decision formulas, and performing decision according to imaginary part data of a to-be-decoded signal obtained through translation and rotation processing.

It can be learned herein that the performing region decision on the to-be-decoded signal according to a region decision rule formed by S region decision formulas, to acquire a region decision result includes: performing calculation by separately substituting the to-be-decoded signal into the S region decision formulas, determining whether a calculation result is greater than 0, and acquiring S region decision results according to a determining result.

That is, after receiving the to-be-decoded signal, a decoder substitutes the to-be-decoded signal into the S region decision formulas that are determined, to perform calculation, and compares the calculation result with 0; optionally, a comparison result is represented by using 0 or 1 of one bit, and the comparison result is used as the region decision result. S region decision results may be acquired by 60 using the S region decision formulas.

Alternatively, the performing region decision on the to-be-decoded signal according to a region decision rule formed by S region decision formulas, to acquire a region decision result includes:

performing translation and rotation processing on the to-be-decoded signal according to the S region decision formulas, determining whether an imaginary part of the to-be-decoded signal is greater than 0, and acquiring S region decision results according to a determining result.

That is, after receiving the to-be-decoded signal, the decoder performs translation and rotation on the to-be-decoded signal according to the region decision formula, acquires the imaginary part of the to-be-decoded signal obtained through the translation and rotation, and compares the imaginary part with 0; optionally, a comparison result is represented by using 0 or 1 of one bit, and the comparison result is used as the region decision result. S region decision results may be acquired by using the S region decision formulas.

Further, if a region decision formula is $ax+by+c=0$, when it is determined that a to-be-decoded signal belongs to which region in two regions divided by a line $ax+by+c=0$, $c/a$ horizontal translation may be first performed on the to-be-decoded signal, then counter rotation is performed at an angle corresponding to a slope, and then it is directly determined whether an imaginary part of a to-be-decoded signal obtained through the translation and rotation is greater than 0, so as to obtain, according to a determining result, which region the to-be-decoded signal belongs to in the two regions divided by the line $ax+by+c=0$.

If $a=0$, the to-be-decoded signal may be longitudinally rotated $c/b$.

Figure 3:
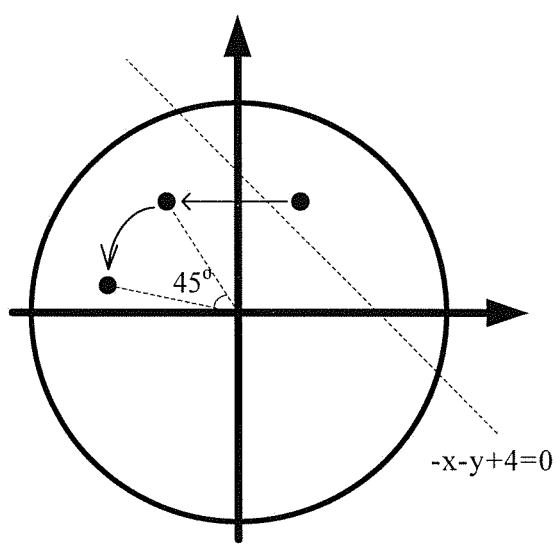
FIG. 3 is a schematic diagram of an example of performing translation and rotation processing on a to-be-decoded signal according to an embodiment of the present invention.

For example, as shown in FIG. 3, the to-be-decoded signal is $x+i*y$, where x is a real part, y is an imaginary part, and i is an imaginary unit. Assuming that a region decision formula is $-x-y+4=0$, $-4$ horizontal translation is first performed on the to-be-decoded signal $x+i*y$, which becomes $(x-4)+i*y$. Because an angle corresponding to a line slope is $-45$ degrees, $(x-4)+i*y$ is rotated $+45$ degrees to obtain a rotated to-be-decoded signal $((x-4)+i*y)*\exp(i*45\pi/180)$; whether an imaginary part of the to-be-decoded signal $((x-4)+i*y)*\exp(i*45\pi/180)$ obtained through the translation and rotation is greater than 0 is determined, where if the imaginary part is greater than 0, it is represented by 1; and if the imaginary part is not greater than 0, it is represented by 0; and then the region decision result is further acquired.

It should be noted that a method for performing region decision on the to-be-decoded signal according to a region decision rule formed by S region decision formulas, to acquire a region decision result may also be another method, which is not limited in the present invention, where the region decision rule may also be another rule.

Further, at least one region decision formula in the S region decision formulas includes: a perpendicular bisector between any two constellation points in at least one subset of the N subsets.

It should be noted that a region decision formula may be determined based on constellation points in the N subsets by using a same method, for example, a perpendicular bisector between any two constellation points in each subset of the N subsets is determined to be the region decision formula. The region decision formula in the N subsets may also be determined by using at least two different methods, for example, a perpendicular bisector between any two constellation points in each subset in M subsets is determined to be the region decision formula, and an angle bisector between any two constellation points in each subset of N-M subsets is determined to be the region decision formula, which is not limited in the present invention.

Preferably, a perpendicular bisector between any two adjacent constellation points in each subset of the N subsets is used as the region decision formula.

Further, because a perpendicular bisector between any two constellation points in each subset of the N subsets is used as the region decision formula, a case in which region decision formulas are the same may exist. In this case, the decoder may aggregate region decision formulas corresponding to each subset, and remove same region decision formulas, so as to acquire S region decision formulas that are different with each other.

Figure 4:
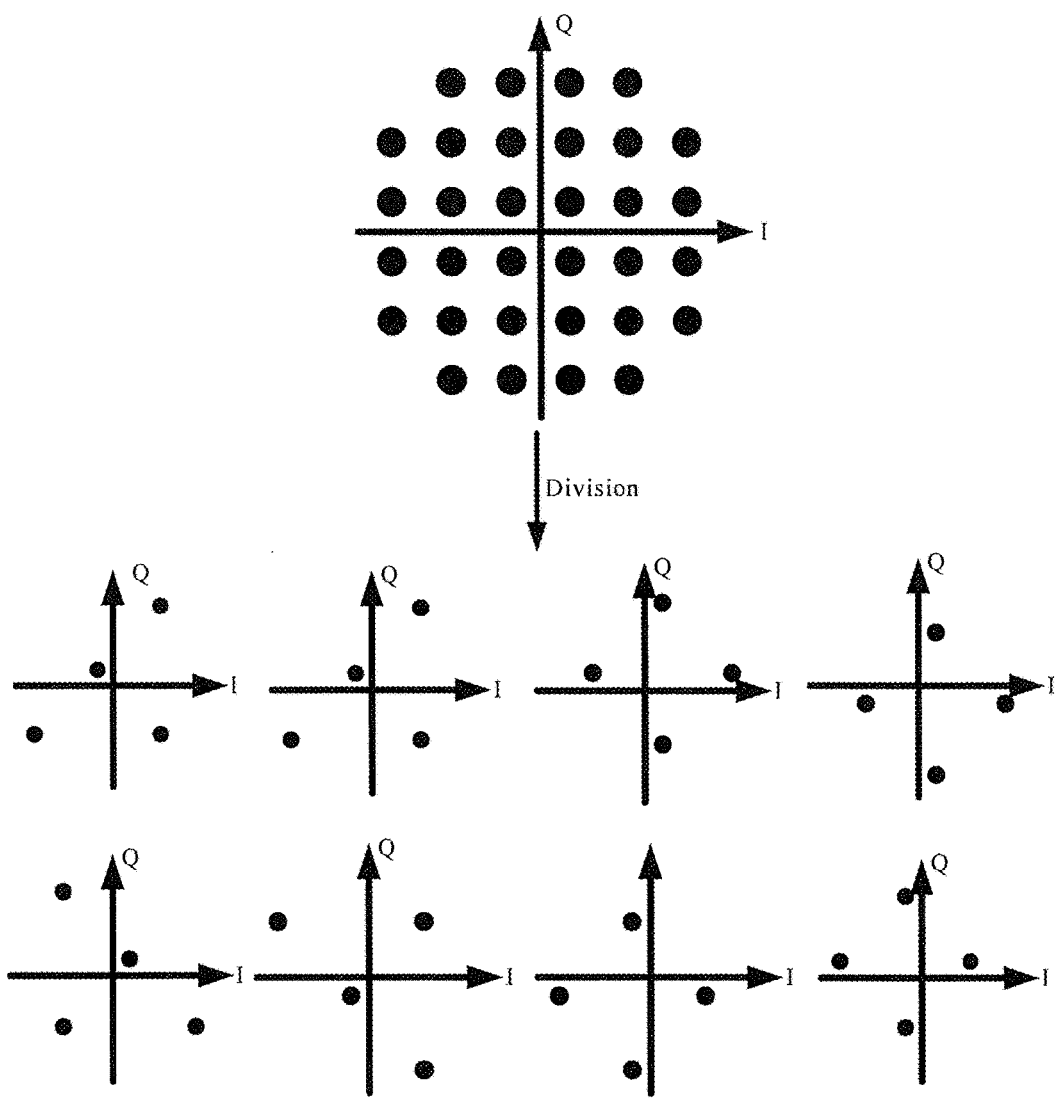
FIG. 4 is a schematic diagram of an example of dividing constellation points according to an embodiment of the present invention.

For example, in a case in which M-QAM (M-Quadrature Amplitude Modulation, M-quadrature amplitude modulation) in TCM (Trellis Coded Modulation, trellis coded modulation) is 32-QAM, 32 constellation points are divided into 8 subsets in advance, where each subset includes 4 constellation points, as shown in FIG. 4. A perpendicular bisector between any two constellation points in each subset of the 8 subsets may be used as the region decision formula. That is, a linear equation corresponding to the perpendicular bisector between the any two constellation points in each subset in the 8 subsets is used as the region decision formula. In this way, for each subset, 6 linear formulas can be acquired.

Further, 48 linear formulas corresponding to the 8 subsets are aggregated, and same linear formulas are removed. Assuming that 14 linear formulas are left after the same formulas are removed, the 14 linear formulas are used as region decision formulas, and in this case, S is 14.

It should be noted that a method for determining a region decision formula according to constellation points in each subset may also be another manner, for example, calculating an included-angle bisector between every two constellation points in each subset, which is not limited in the present invention.

103: Acquire N constellation points according to the decision result.

The N constellation points are separately constellation points that are in the N subsets and that are closest to the to-be-decoded signal.

Specifically, after acquiring S decision results, the decoder may find constellation points closest to the to-be-decoded signal in each subset of the N subsets according to the S decision results, that is, acquiring the N constellation points.

Further, the acquiring N constellation points according to the decision result includes: acquiring the N constellation points according to the decision result and a first mapping table.

The first mapping table is a table of correspondences between decision results and constellation points. Each decision result in the first mapping table is corresponding to one group of constellation points, and the group of constellation points are formed by the N constellation points that are from the N subsets separately.

It should be noted that the first mapping table is preset.

It should be noted that the decoder may further acquire the N constellation points according to the S decision results in another manner, which is not limited in the present invention.

104: Acquire N non-encoded bits corresponding to the N constellation points, and branch metrics between the to-be-decoded signal and the N constellation points.

Specifically, after acquiring the N constellation points, that is, acquiring the constellation points closest to the to-be-decoded signal, the decoder may acquire, according to the N constellation points, the corresponding N non-encoded bits and the branch metrics between the to-be-decoded signal and the N constellation points.

Further, the decoder may search a second mapping table according to the N constellation points to acquire non-encoded bits corresponding to the N constellation points, and the branch metrics between the to-be-decoded signal and the N constellation points.

The second mapping table is a table of correspondences between constellation points, non-encoded, and branch metrics.

It should be noted that the first mapping table is preset.

It should be noted that, after constellation points in a constellation diagram are divided into at least two subsets, when encoding is performed, a received information bit is divided into two parts, namely, an encoded bit and a non-encoded bit. A corresponding subset is selected by using the encoded bit, and one constellation point is selected from the subset by using the non-encoded bit. Therefore, in a decoding process, after a constellation point is determined, a non-encoded bit corresponding to the constellation point and a branch metric between the to-be-decoded signal and the constellation point can be obtained through decoding.

It should be noted that the first mapping table and the second mapping table may be a same mapping table, or may be different mapping tables, which is not limited in the present invention.

105: Perform Viterbi decoding based on the branch metrics and the N non-encoded bits, and output a decoding result corresponding to the to-be-decoded signal.

Specifically, after acquiring the branch metrics between the to-be-decoded signal and the N constellation points, and the N non-encoded bits, the decoder performs Viterbi decoding, and may output the decoding result corresponding to the to-be-decoded signal.

It should be noted that the performing Viterbi decoding according to the non-encoded bits and the branch metrics to acquire the decoding result is the same as that in the prior art, and details are not repeatedly described herein.

This embodiment of the present invention provides a decoding method. After a to-be-decoded signal is received, region decision is performed on the to-be-decoded signal according to a region decision rule formed by S region decision formulas, to acquire a region decision result; N constellation points are acquired according to the region decision result; N non-encoded bits corresponding to the N constellation points, and branch metrics between the to-be-decoded signal and the N constellation points are acquired; and Viterbi decoding is performed on the N non-encoded bits and the branch metrics to acquire a decoding result. In this way, when decoding is performed, the N constellation points and the branch metrics may be acquired for Viterbi decoding to acquire the decoding result, with no need to calculate Euclidean distances between the to-be-decoded signal and all constellation points in a constellation diagram, thereby reducing decoding complexity. Further, after the decision result is acquired, the N constellation points may be acquired by using a first mapping table, and a second mapping table is searched according to the N constellation points to acquire the branch metrics and the N non-encoded bits, thereby reducing decoding time. In addition, the branch metrics may be obtained, with no need to perform a large amount of calculation, thereby further improving the system efficiency and reducing the decoding complexity.

Figure 5:
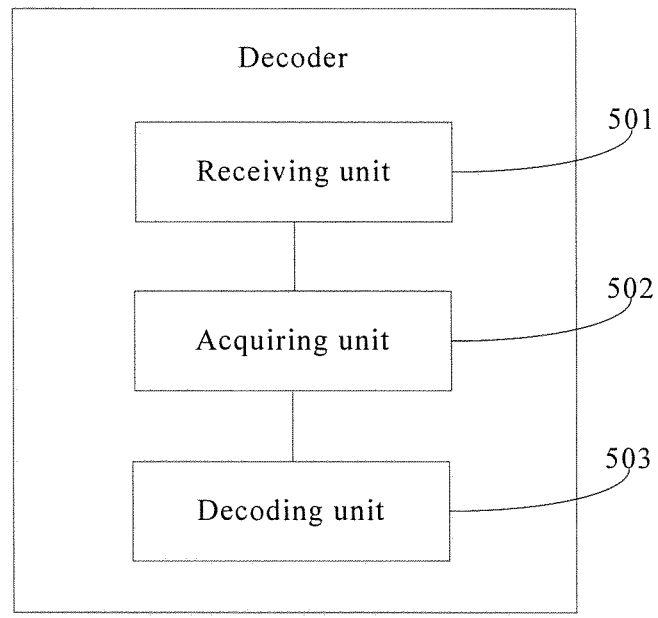
FIG. 5 is a schematic block diagram of a decoder according to an embodiment of the present invention.

FIG. 5 is a schematic block diagram of a decoder according to an embodiment of the present invention. As shown in FIG. 5, the decoder includes a receiving unit 501, an acquiring unit 502, and a decoding unit 503.

The receiving unit 501 is configured to receive a to-be-decoded signal.

The acquiring unit 502 is configured to perform, according to a region decision rule formed by S region decision formulas, region decision on the to-be-decoded signal that is received by the receiving unit 501, to acquire a region decision result.

S is a positive integer and is less than the total number of constellation points included in N subsets that are used as a basis for generating the decoded signal at an encoding end, N is a positive integer greater than 1, every two constellation points in each subset are separately located in two different regions that are divided by using at least one decision formula in the S region decision formulas, and constellation points in the constellation diagram are divided into N subsets.

Specifically, the acquiring unit 502 is specifically configured to perform calculation by separately substituting the to-be-decoded signal into the S region decision formulas, determine whether a calculation result is greater than 0, and acquire S region decision results according to a determining result.

Alternatively, the acquiring unit 502 is specifically configured to perform translation and rotation processing on the to-be-decoded signal according to the S region decision formulas, determine whether an imaginary part of the to-be-decoded signal is greater than 0, and acquire S region decision results according to a determining result.

Further, if a region decision formula is ax+by+c=0, when it is determined that a to-be-decoded signal belongs to which region in two regions divided by a line ax+by+c=0, c/a horizontal translation may be first performed on the to-be-decoded signal, then counter rotation is performed at an angle corresponding to a slope, and then it is directly determined whether an imaginary part of a to-be-decoded signal obtained through the translation and rotation is greater than 0, so as to obtain, according to a determining result, which region the to-be-decoded signal belongs to in the two regions divided by the line ax+by+c=0.

If a=0, the to-be-decoded signal may be longitudinally rotated c/b.

Further, at least one region decision formula in the S region decision formulas includes: a perpendicular bisector between any two adjacent constellation points in at least one subset of the N subsets.

Preferably, a perpendicular bisector between any two adjacent constellation points in each subset of the N subsets is used as the region decision formula.

The acquiring unit 502 is further configured to acquire N constellation points according to the decision result, where the N constellation points are separately constellation points that are in the N subsets and that are closest to the to-be-decoded signal.

Specifically, the acquiring unit 502 is specifically configured to acquire the N constellation points according to the decision result and a first mapping table.

The first mapping table is a table of correspondences between decision results and constellation points; and each decision result in the first mapping table is corresponding to one group of constellation points, and the group of constellation points are formed by the N constellation points that are from the N subsets separately.

The acquiring unit 502 is further configured to acquire N non-encoded bits corresponding to the N constellation points, and branch metrics between the to-be-decoded signal and the N constellation points.

Specifically, the acquiring unit 502 is specifically configured to search a second mapping table according to the N constellation points to acquire non-encoded bits corresponding to the N constellation points, and the branch metrics between the to-be-decoded signal and the N constellation points.

The second mapping table is a table of correspondences between constellation points, non-encoded, and branch metrics.

The decoding unit 503 is configured to perform Viterbi decoding based on the branch metrics and the N non-encoded bits that are acquired by the acquiring unit 502, and output a decoding result corresponding to the to-be-decoded signal.

This embodiment of the present invention provides a decoder. After a to-be-decoded signal is received, region decision is performed on the to-be-decoded signal according to a region decision rule formed by S region decision formulas, to acquire a region decision result; N constellation points are acquired according to the region decision result; N non-encoded bits corresponding to the N constellation points, and branch metrics between the to-be-decoded signal and the N constellation points are acquired; and Viterbi decoding is performed on the N non-encoded bits and the branch metrics to acquire a decoding result. In this way, when decoding is performed, the N constellation points and the branch metrics may be acquired for Viterbi decoding to acquire the decoding result, with no need to calculate Euclidean distances between the to-be-decoded signal and all constellation points in a constellation diagram, thereby reducing decoding complexity. Further, after the decision result is acquired, the N constellation points may be acquired by using a first mapping table, and a second mapping table is searched according to the N constellation points to acquire the branch metrics and the N non-encoded bits, thereby reducing decoding time. In addition, the branch metrics may be obtained, with no need to perform a large amount of calculation, thereby further improving the system efficiency and reducing the decoding complexity.

Figure 6:
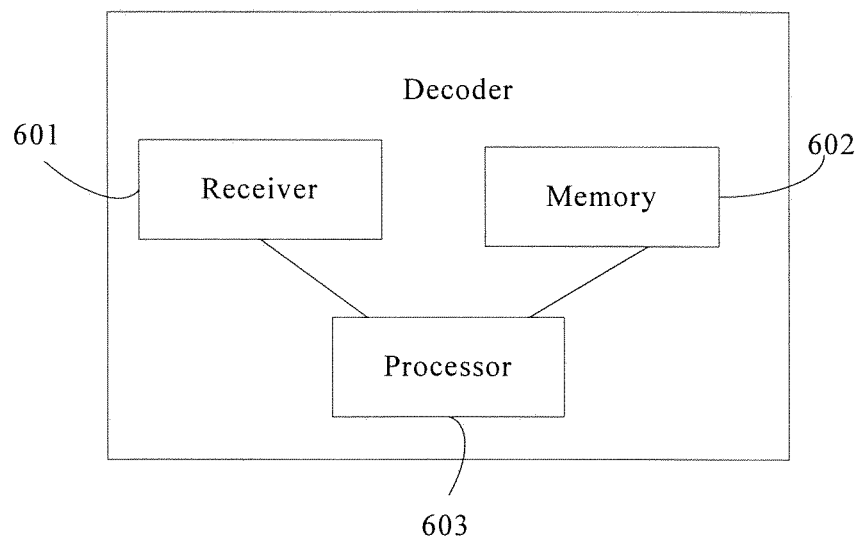
FIG. 6 is a schematic structural diagram of a decoder according to an embodiment of the present invention.

FIG. 6 is a schematic structural diagram of a decoder according to an embodiment of the present invention. As shown in FIG. 6, the decoder includes: a receiver 601, a memory (memory) 602, and a processor (processor) 603 that is separately connected to the receiver 601 and the memory 602. The processor 603 may be a central processing unit CPU, or an application specific integrated circuit ASIC (Application Specific Integrated Circuit), or be configured as one or more integrated circuits that implement the embodiments of the present invention. The memory 602 is configured to store program code, where the program code includes a computer operation instruction.

The receiver 601 is configured to receive a to-be-decoded signal.

The processor 603 is configured to perform, according to a region decision rule formed by S region decision formulas, region decision on the to-be-decoded signal that is received by the receiver 601, to acquire a region decision result.

S is a positive integer and is less than the total number of constellation points included in N subsets that are used as a basis for generating the decoded signal at an encoding end, N is a positive integer greater than 1, every two constellation points in each subset are separately located in two different regions that are divided by using at least one decision formula in the S region decision formulas, and constellation points in the constellation diagram are divided into N subsets.

Specifically, the processor 603 is specifically configured to perform calculation by separately substituting the to-be-decoded signal into the S region decision formulas, determine whether a calculation result is greater than 0, and acquire S region decision results according to a determining result.

Alternatively, the processor 603 is specifically configured to perform translation and rotation processing on the to-be-decoded signal according to the S region decision formulas, determine whether an imaginary part of the to-be-decoded signal is greater than 0, and acquire S region decision results according to a determining result.

Further, if a region decision formula is $ax+by+c=0$, when it is determined that a to-be-decoded signal belongs to which region in two regions divided by a line $ax+by+c=0$, $c/a$ horizontal translation may be first performed on the to-be-decoded signal, then counter rotation is performed at an angle corresponding to a slope, and then it is directly determined whether an imaginary part of a to-be-decoded signal obtained through the translation and rotation is greater than 0, so as to obtain, according to a determining result, which region the to-be-decoded signal belongs to in the two regions divided by the line $ax+by+c=0$.

If $a=0$, the to-be-decoded signal may be longitudinally rotated $c/b$.

Further, at least one region decision formula in the S region decision formulas includes: a perpendicular bisector between any two adjacent constellation points in at least one subset of the N subsets.

Preferably, a perpendicular bisector between any two adjacent constellation points in each subset of the N subsets is used as the region decision formula.

The processor 603 is further configured to acquire N constellation points according to the decision result, where the N constellation points are separately constellation points that are in the N subsets and that are closest to the to-be-decoded signal.

Specifically, the processor 603 is specifically configured to acquire the N constellation points according to the decision result and a first mapping table.

The first mapping table is a table of correspondences between decision results and constellation points; and each decision result in the first mapping table is corresponding to one group of constellation points, and the group of constellation points are formed by the N constellation points that are from the N subsets separately.

The processor 603 is further configured to acquire N non-encoded bits corresponding to the N constellation points, and branch metrics between the to-be-decoded signal and the N constellation points.

Specifically, the processor 603 is specifically configured to search a second mapping table according to the N constellation points to acquire non-encoded bits corresponding to the N constellation points, and the branch metrics between the to-be-decoded signal and the N constellation points.

The second mapping table is a table of correspondences between constellation points, non-encoded, and branch metrics.

The processor 603 is further configured to perform Viterbi decoding based on the branch metrics and the N non-encoded bits, and output a decoding result corresponding to the to-be-decoded signal.

This embodiment of the present invention provides a decoder. After a to-be-decoded signal is received, region decision is performed on the to-be-decoded signal according to a region decision rule formed by S region decision formulas, to acquire a region decision result; N constellation points are acquired according to the region decision result; N non-encoded bits corresponding to the N constellation points, and branch metrics between the to-be-decoded signal and the N constellation points are acquired; and Viterbi decoding is performed on the N non-encoded bits and the branch metrics to acquire a decoding result. In this way, when decoding is performed, the N constellation points and the branch metrics may be acquired for Viterbi decoding to acquire the decoding result, with no need to calculate Euclidean distances between the to-be-decoded signal and all constellation points in a constellation diagram, thereby reducing decoding complexity. Further, after the decision result is acquired, the N constellation points may be acquired by using a first mapping table, and a second mapping table is searched according to the N constellation points to acquire the branch metrics and the N non-encoded bits, thereby reducing decoding time. In addition, the branch metrics may be obtained, with no need to perform a large amount of calculation, thereby further improving the system efficiency and reducing the decoding complexity.

In the several embodiments provided in the present application, it should be understood that the disclosed apparatus and method may be implemented in other manners. For example, the described apparatus embodiment is merely exemplary. For example, the unit division is merely logical function division and may be other division in actual implementation. For example, a plurality of units or components may be combined or integrated into another system, or some features may be ignored or not performed. In addition, the displayed or discussed mutual couplings or direct couplings or communication connections may be implemented through some interfaces. The indirect couplings or communication connections between the apparatuses or units may be implemented in electronic, mechanical, or other forms.

The units described as separate parts may or may not be physically separate, and parts displayed as units may or may not be physical units, may be located in one position, or may be distributed on a plurality of network units. Some or all of the units may be selected according to actual needs to achieve the objectives of the solutions of the embodiments.

In addition, functional units in the embodiments of the present invention may be integrated into one processing unit, or each of the units may exist alone physically, or two or more units are integrated into one unit. The integrated unit may be implemented in a form of hardware, or may be implemented in a form of hardware in addition to a software functional unit.

When the foregoing integrated unit is implemented in a form of a software functional unit, the integrated unit may be stored in a computer-readable storage medium. The software functional unit is stored in a storage medium and includes several instructions for instructing a computer device (which may be a personal computer, a server, a network device, or the like) to perform some of the steps of the methods described in the embodiments of the present invention. The foregoing storage medium includes: any medium that can store program code, such as a USB flash drive, a removable hard disk, a read-only memory (Read-Only Memory, ROM), a random access memory (Random Access Memory, RAM), a magnetic disk, or an optical disc.

Finally, it should be noted that the foregoing embodiments are merely intended for describing the technical solutions of the present invention but not for limiting the present invention. Although the present invention is described in detail with reference to the foregoing embodiments, persons of ordinary skill in the art should understand that they may still make modifications to the technical solutions described in the foregoing embodiments or make equivalent replacements to some technical features thereof, as long as such modifications or replacements do not cause the essence of corresponding technical solutions to depart from the spirit and scope of the technical solutions of the embodiments of the present invention.

What is claimed is:

1. A decoding method, comprising:

receiving a to-be-decoded signal;

performing region decision on the to-be-decoded signal according to a region decision rule formed by S region decision formulas, to acquire a region decision result, wherein S is a positive integer less than the total number of constellation points comprised in N subsets that are used as a basis for generating the to-be-decoded signal at an encoding end, N is a positive integer greater than 1, every two constellation points in each subset are separately located in two different regions that are divided by using at least one decision formula in the S region decision formulas, and constellation points in the constellation diagram are divided into N subsets;

acquiring N constellation points according to the decision result, wherein the N constellation points are separately constellation points that are in the N subsets and closest to the to-be-decoded signal;

acquiring N non-encoded bits corresponding to the N constellation points, and branch metrics between the to-be-decoded signal and the N constellation points; and performing Viterbi decoding based on the branch metrics and the N non-encoded bits, and outputting a decoding result corresponding to the to-be-decoded signal.

2. The method according to claim 1, wherein performing region decision on the to-be-decoded signal according to a region decision rule formed by S region decision formulas, to acquire a region decision result comprises:

performing calculation by separately substituting the to-be-decoded signal into the S region decision formulas, determining whether a calculation result is greater than 0, and acquiring S region decision results according to a determining result.

3. The method according to claim 1, wherein performing region decision on the to-be-decoded signal according to a region decision rule formed by S region decision formulas, to acquire a region decision result comprises:

performing translation and rotation processing on the to-be-decoded signal according to the S region decision formulas, determining whether an imaginary part of the to-be-decoded signal is greater than 0, and acquiring S region decision results according to a determining result.

4. The method according to claim 1, wherein at least one region decision formula in the S region decision formulas comprises:

a perpendicular bisector between any two constellation points in at least one subset of the N subsets.

5. The method according to claim 1, wherein acquiring N constellation points according to the decision result comprises:

acquiring the N constellation points according to the decision result and a first mapping table, wherein the first mapping table is a table of correspondences between decision results and constellation points; and each decision result in the first mapping table is corresponding to one group of constellation points, and the group of constellation points are formed by the N constellation points that are from the N subsets separately.

6. The method according to claim 1, wherein acquiring N non-encoded bits corresponding to the N constellation points, and branch metrics between the to-be-decoded signal and the N constellation points comprises:

searching a second mapping table according to the N constellation points to acquire non-encoded bits corresponding to the N constellation points, and the branch metrics between the to-be-decoded signal and the N constellation points, wherein the second mapping table is a table of correspondences between constellation points, non-encoded bits, and branch metrics.

7. A decoder, comprising:

a receiving unit, configured to receive a to-be-decoded signal;

an acquiring unit, configured to:

perform, according to a region decision rule formed by S region decision formulas, region decision on the to-be-decoded signal that is received by the receiving unit, to acquire a region decision result, wherein S is a positive integer less than the total number of constellation points comprised in N subsets that are used as a basis for generating the to-be-decoded signal at an encoding end, N is a positive integer greater than 1, every two constellation points in each subset are separately located in two different regions that are divided by using at least one decision formula in the S region decision formulas, and constellation points in the constellation diagram are divided into N subsets, acquire N constellation points according to the decision result, wherein the N constellation points are separately constellation points that are in the N subsets and closest to the to-be-decoded signal, and acquire N non-encoded bits corresponding to the N constellation points, and branch metrics between the to-be-decoded signal and the N constellation points; and a decoding unit, configured to perform Viterbi decoding based on the branch metrics and the N non-encoded bits that are acquired by the acquiring unit, and output a decoding result corresponding to the to-be-decoded signal.

8. The decoder according to claim 7, wherein the acquiring unit is configured to:

perform calculation by separately substituting the to-be-decoded signal into the S region decision formulas, determine whether a calculation result is greater than 0, and acquire S region decision results according to a determining result.

9. The decoder according to claim 8, wherein the acquiring unit is configured to:

perform translation and rotation processing on the to-be-decoded signal according to the S region decision formulas, determine whether an imaginary part of the to-be-decoded signal is greater than 0, and acquire S region decision results according to a determining result.

10. The decoder according to claim 7, wherein at least one region decision formula in the S region decision formulas comprises:

a perpendicular bisector between any two adjacent constellation points in at least one subset of the N subsets.

11. The decoder according to claim 7, wherein the acquiring unit is configured to:

acquire the N constellation points according to the decision result and a first mapping table, wherein the first mapping table is a table of correspondences between decision results and constellation points; and each decision result in the first mapping table is corresponding to one group of constellation points, and the group of constellation points are formed by the N constellation points that are from the N subsets separately.

12. The decoder according to claim 7, wherein the acquiring unit is configured to:

search a second mapping table according to the N constellation points to acquire non-encoded bits corresponding to the N constellation points, and the branch metrics between the to-be-decoded signal and the N constellation points, wherein the second mapping table is a table of correspondences between constellation points, non-encoded bits, and branch metrics.

* * * * *